United States Patent
Watanabe

(10) Patent No.: US 9,852,987 B2
(45) Date of Patent: Dec. 26, 2017

(54) SEMICONDUCTOR DEVICE AND METHOD OF MANUFACTURING THE SAME

(71) Applicant: Toshiba Memory Corporation, Minato-ku (JP)

(72) Inventor: Takashi Watanabe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 86 days.

(21) Appl. No.: 14/753,680

(22) Filed: Jun. 29, 2015

(65) Prior Publication Data
US 2016/0247762 A1   Aug. 25, 2016

Related U.S. Application Data

(60) Provisional application No. 62/119,612, filed on Feb. 23, 2015.

(51) Int. Cl.
*H01L 23/528* (2006.01)
*H01L 23/532* (2006.01)
*H01L 21/768* (2006.01)
*H01L 27/11529* (2017.01)

(52) U.S. Cl.
CPC .... *H01L 23/5283* (2013.01); *H01L 21/76834* (2013.01); *H01L 21/76885* (2013.01); *H01L 23/53295* (2013.01); *H01L 21/7682* (2013.01); *H01L 23/53223* (2013.01); *H01L 23/53238* (2013.01); *H01L 23/53266* (2013.01); *H01L 27/11529* (2013.01)

(58) Field of Classification Search
None
See application file for complete search history.

(56) References Cited

U.S. PATENT DOCUMENTS

| | | | |
|---|---|---|---|
| 6,611,060 B1 | 8/2003 | Toyoda et al. | |
| 7,473,632 B2 | 1/2009 | Ueda | |
| 7,553,756 B2 | 6/2009 | Hayashi et al. | |
| 8,420,528 B2 | 4/2013 | Noguchi | |
| 2002/0167089 A1* | 11/2002 | Ahn | H01L 21/28556 257/762 |

(Continued)

FOREIGN PATENT DOCUMENTS

| | | |
|---|---|---|
| JP | 11-154702 | 6/1999 |
| JP | 2001-110769 | 4/2001 |

(Continued)

*Primary Examiner* — Michael Carter
(74) *Attorney, Agent, or Firm* — Oblon, McClelland, Maier & Neustadt, L.L.P.

(57) ABSTRACT

In one embodiment, a semiconductor device includes a substrate. The device further includes a first interconnect which includes a first layer provided on the substrate and formed of a first interconnect material, and a second layer provided on the first layer, formed of a second interconnect material different from the first interconnect material, and having a first lower face, and has a first width. The device further includes a second interconnect which includes a third layer provided on the substrate and formed of the first interconnect material, a fourth layer provided on the third layer, formed of the second interconnect material, and having a second lower face lower than the first lower face, and has a second width greater than the first width.

10 Claims, 12 Drawing Sheets

(56) References Cited

U.S. PATENT DOCUMENTS

| | | | |
|---|---|---|---|
| 2004/0007777 A1* | 1/2004 | Kono | H01L 23/5258 |
| | | | 257/758 |
| 2006/0088975 A1* | 4/2006 | Ueda | H01L 21/76801 |
| | | | 438/421 |
| 2008/0268594 A1* | 10/2008 | Kim | H01L 27/105 |
| | | | 438/258 |
| 2009/0026618 A1* | 1/2009 | Kim | H01L 21/76843 |
| | | | 257/751 |
| 2015/0171003 A1 | 6/2015 | Morita et al. | |

FOREIGN PATENT DOCUMENTS

| | | |
|---|---|---|
| JP | 2006-120988 | 5/2006 |
| JP | 4918778 | 4/2012 |
| JP | 2013-45807 | 3/2013 |
| JP | 2013-197533 | 9/2013 |
| JP | 5396065 | 1/2014 |

\* cited by examiner

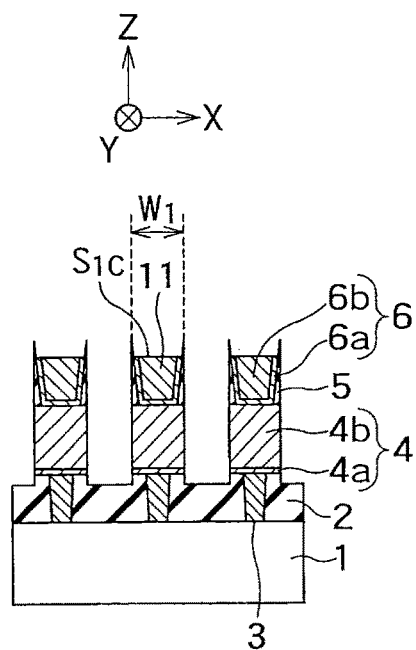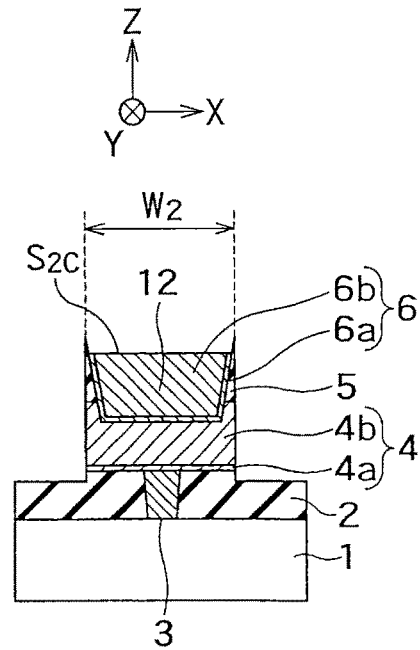
FIG. 20A  FIG. 20B
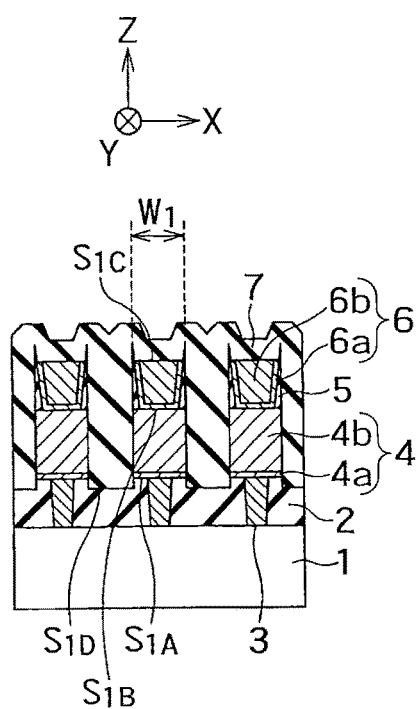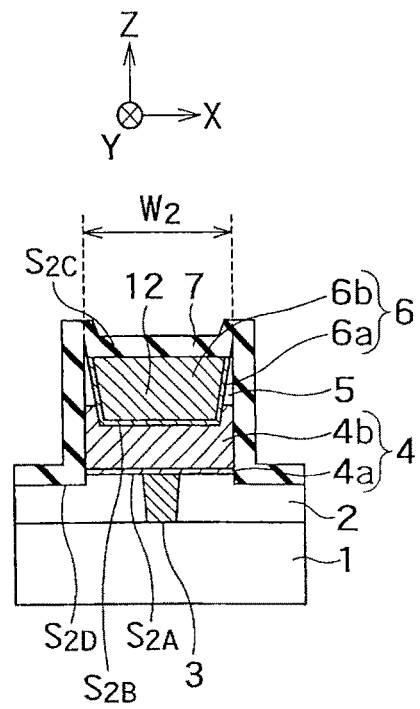
FIG. 21A  FIG. 21B

US 9,852,987 B2

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/119,612 filed on Feb. 23, 2015, the entire contents of which are incorporated herein by reference.

FIELD

Embodiments described herein relate to a semiconductor device and a method of manufacturing the same.

BACKGROUND

Due to size shrinkage of a semiconductor device, there are problems that reduction of cross sections of interconnects causes an increase in resistance of the interconnects and reduction of a distance between the interconnects causes an increase in capacitance between the interconnects. Therefore, it is considered that the interconnects are formed of copper (Cu) that has a low specific resistance to reduce the resistance of the interconnects. Furthermore, it is considered that air gaps are formed between the interconnects to reduce the capacitance between the interconnects.

Examples of the interconnects in the semiconductor device include a RIE (reactive ion etching) interconnect that is formed by RIE and a damascene interconnect that is formed by a damascene process. However, since copper cannot be processed by RIE, copper cannot be used for the RIE interconnect and therefore the resistance of the RIE interconnect cannot be reduced by copper. In contrast, copper can be used for the damascene interconnect. However, when an interconnect trench for embedding the damascene interconnect is minute, the interconnect thickness is limited due to the embedding limit of copper. Therefore, when the damascene interconnect is formed of copper, the interconnect thickness cannot be large enough and therefore the resistance of the damascene interconnect cannot be sufficiently reduced.

BRIEF DESCRIPTION OF THE DRAWINGS

FIGS. 16A to 21B are cross sectional views showing a method of manufacturing the semiconductor device of the third embodiment.

DETAILED DESCRIPTION

Embodiments will now be explained with reference to the accompanying drawings.

In one embodiment, a semiconductor device includes a substrate. The device further includes a first interconnect which includes a first layer provided on the substrate and formed of a first interconnect material, and a second layer provided on the first layer, formed of a second interconnect material different from the first interconnect material, and having a first lower face, and has a first width. The device further includes a second interconnect which includes a third layer provided on the substrate and formed of the first interconnect material, a fourth layer provided on the third layer, formed of the second interconnect material, and having a second lower face lower than the first lower face, and has a second width greater than the first width.

First Embodiment

Figure 1A:
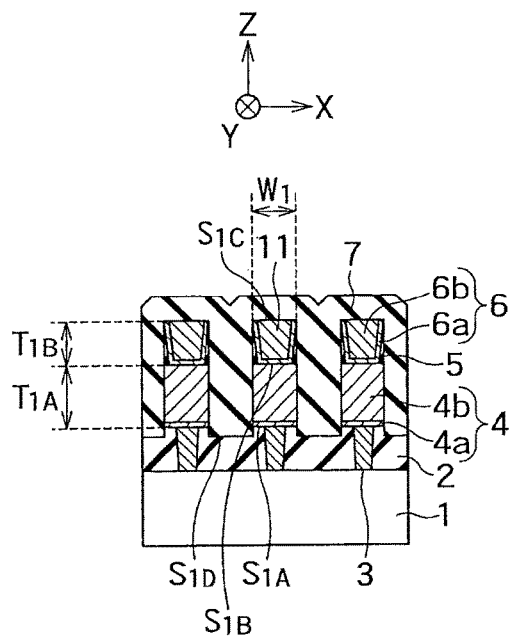
FIGS. 1A to 1C are cross sectional views showing a structure of a semiconductor device of a first embodiment.
Figure 1B:
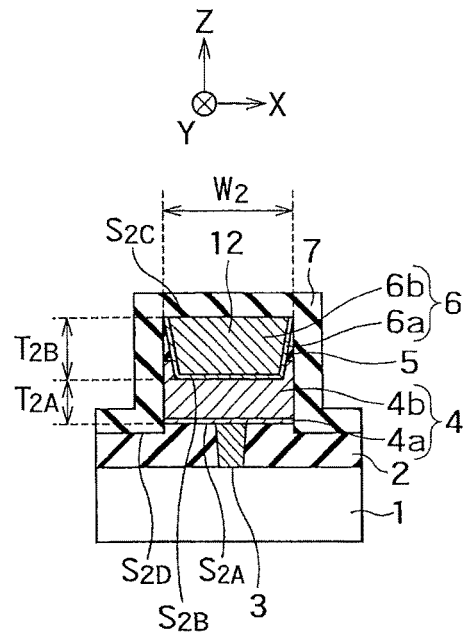
Figure 1C:
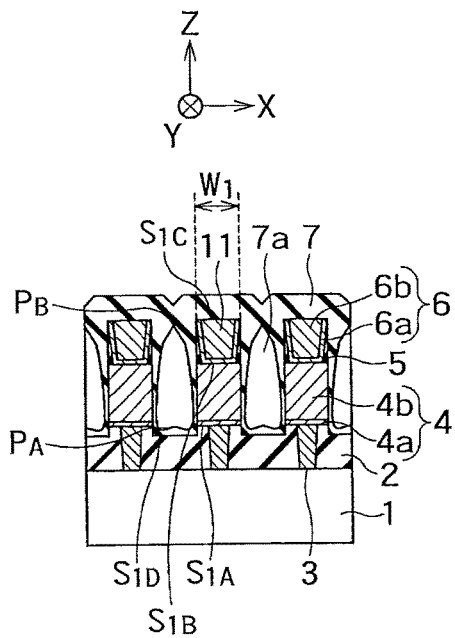

FIGS. 1A to 1C are cross sectional views showing a structure of a semiconductor device of a first embodiment. An example of the semiconductor device of the present embodiment is a semiconductor memory such as a NAND flash memory.

FIG. 1A shows first interconnects 11 formed in a memory cell region on a substrate 1. The memory cell region includes cell transistors and selection transistors that are not shown. Examples of the first interconnects 11 include bit lines. FIG. 1B shows a second interconnect 12 formed in a peripheral circuit region on the substrate 1. The peripheral circuit region includes peripheral transistors that are not shown. Examples of the second interconnect 12 include interconnects located in the same layer as the bit lines. FIG. 1C shows a modification of the interconnect structure of FIG. 1A.

The interconnect structures of FIGS. 1A and 1B will be described below. The interconnect structure of FIG. 1C will be described thereafter.

As shown in FIGS. 1A and 1B, the semiconductor device of the present embodiment includes the substrate 1, a lower insulator 2, via plugs 3, a lower interconnect layer 4 including a barrier metal layer 4a and an interconnect material layer 4b, a sidewall insulator 5, an upper interconnect layer 6 including a barrier metal layer 6a and an interconnect material layer 6b, and an upper insulator 7. The lower interconnect layer 4 is an example of a first interconnect material. The sidewall insulator 5 is an example of a first film. The upper interconnect layer 6 is an example of a second interconnect material different from the first interconnect material. The upper insulator 7 is an example of the first insulator.

For example, the substrate 1 includes a semiconductor substrate and one or more interconnect layers formed on the semiconductor substrate. The lower insulator 2 is formed on these interconnect layers, for example. The via plugs 3 are electrically connected to any one of these interconnect layers, for example. The substrate 1, the lower insulator 2 and the via plugs 3 will be described hereafter in detail.

The first interconnects 11 includes the lower interconnect layer 4 and the upper interconnect layer 6. The lower interconnect layer 4 of the first interconnects 11 is an example of a first layer. The upper interconnect layer 6 of the first interconnects 11 is an example of a second layer. The first interconnects 11 of the present embodiment extend in a Y direction and have a first width $W_1$ in an X direction. The first width $W_1$ of the present embodiment is 19 nm. Similarly, the distances between the first interconnects 11 of the present embodiment are 19 nm.

The second interconnect 12 also includes the lower interconnect layer 4 and the upper interconnect layer 6. The lower interconnect layer 4 of the second interconnect 12 is an example of a third layer. The upper interconnect layer 6 of the second interconnect 12 is an example of a fourth layer. The second interconnect 12 of the present embodiment extends in various directions and has a second width $W_2$. FIG. 1B shows a portion of the second interconnect 12 extending in the Y direction, and this portion has the second width $W_2$ in the X direction. The second width $W_2$ of the present embodiment is set greater than the first width $W_1$. The second width $W_2$ of the present embodiment is set at from 50 nm to 1 μm.

Each of the first and second interconnects 11 and 12 of the present embodiment is formed in a self-aligned manner so as to include a pair of the lower interconnect layer 4 and the upper interconnect layer 6.

The substrate 1 includes, for example, the semiconductor substrate and the one or more interconnect layers formed on the semiconductor substrate, as described above. An example of the semiconductor substrate is a silicon substrate. FIGS. 1A and 1B show the X direction and the Y direction that are parallel to the surface of the substrate 1 and orthogonal to each other, and a Z direction that is orthogonal to the surface of the substrate 1. The present specification treats the +Z direction as an upward direction and the −Z direction as a downward direction. For example, the positional relationship between the substrate 1 and the lower insulator 2 is expressed as that the substrate 1 is positioned below the lower insulator 2. The −Z direction of the present embodiment may be identical to a gravity direction or may not be identical to the gravity direction.

The lower insulator 2 is formed on the substrate 1. Examples of the lower insulator 2 are silicon oxide films and silicon nitride films. The lower insulator 2 may be a stacked film including plural insulators. The lower insulator 2 may be directly formed on the substrate 1 or may be formed on the substrate 1 via another layer. The lower insulator 2 is, for example, an inter layer dielectric.

The via plugs 3 are formed in the lower insulator 2. An example of the via plugs 3 is tungsten (W) layers. The via plugs 3 are formed, for example, by forming via holes in the lower insulator 2, embedding a plug material of the via plugs 3 in the via holes, and removing excess plug material outside the via holes. The via plugs 3 are formed, for example, on the interconnects in the substrate 1. The first and second interconnects 11 and 12 of the present embodiment are formed on the via plugs 3.

The via plugs 3 of the present embodiment may be formed on diffusion layers formed in the semiconductor substrate of the substrate 1. In this case, the substrate 1 may be the semiconductor substrate itself, and the lower insulator 2 may be directly formed on the semiconductor substrate.

The lower interconnect layer 4 includes the barrier metal layer 4a formed on the via plugs 3, and the interconnect material layer 4b formed on the barrier metal layer 4a. The lower interconnect layer 4 of each interconnect 11, 12 of the present embodiment is formed by RIE. Therefore, the barrier metal layer 4a of each interconnect 11, 12 is in contact with the lower face of the interconnect material layer 4b but is not in contact with the side faces of the interconnect material layer 4b.

The barrier metal layer 4a and the interconnect material layer 4b of the present embodiment are formed of materials that can be processed by RIE. An example of the barrier metal layer 4a is a titanium (Ti) layer. Examples of the interconnect material layer 4b are a tungsten (W) layer, an aluminum (Al) layer and a molybdenum (Mo) layer.

FIG. 1A shows a lower face $S_{1A}$ and a thickness $T_{1A}$, of the lower interconnect layer 4 of the first interconnects 11. The lower face $S_{1A}$ corresponds to lower faces of the first interconnects 11. FIG. 1B shows a lower face $S_{2A}$ and a thickness $T_{2A}$ of the lower interconnect layer 4 of the second interconnect 12. The lower face $S_{2A}$ corresponds to a lower face of the second interconnect 12. The lower face $S_{2A}$ of the present embodiment is set at substantially the same height as the lower face $S_{1A}$. The thickness $T_{2A}$ of the present embodiment is set smaller than the thickness $T_{1A}$. The thicknesses $T_{1A}$ and $T_{2A}$ of the present embodiment are 40 nm and 25 nm, respectively.

FIG. 1A further shows bottom faces $S_{1D}$ of trenches that are adjacent to the first interconnects 11. The bottom faces $S_{1D}$ correspond to an upper face of the lower insulator 2. FIG. 1B further shows bottom faces $S_{2D}$ of trenches that are adjacent to the second interconnect 12. The bottom faces $S_{2D}$ correspond to the upper face of the lower insulator 2. The bottom faces $S_{1D}$ and $S_{2D}$ of these trenches of the present embodiment are set lower than the lower faces $S_{1A}$ and $S_{2A}$ of the first and second interconnects 11 and 12.

The upper interconnect layer 6 includes the barrier metal layer 6a formed on the lower interconnect layer 4, and the interconnect material layer 6b formed on the barrier metal layer 6a. The upper interconnect layer 6 of each interconnect 11, 12 of the present embodiment is formed by the damascene process. Therefore, the barrier metal layer 6a of each interconnect 11, 12 is in contact with the lower face and the side faces of the interconnect material layer 6b.

The barrier metal layer 6a and the interconnect material layer 6b of the present embodiment are formed of materials that can be processed by the damascene process. An example of the barrier metal layer 6a is a titanium (Ti) layer. An example of the interconnect material layer 6b is a copper (Cu) layer. Since the upper interconnect layer 6 of the present embodiment is formed by the damascene process, the interconnect material layer 6b can be formed of copper that has a low specific resistance.

FIG. 1A shows a lower face $S_{1B}$, an upper face $S_{1C}$, and a thickness $T_{1B}$ of the upper interconnect layer 6 of the first interconnects 11. The lower face $S_{1B}$ is an example of a first lower face. The upper face $S_{1C}$ correspond to upper faces of the first interconnects 11. FIG. 1B shows a lower face $S_{2B}$, an upper face $S_{2C}$, and a thickness $T_{2B}$ of the upper interconnect layer 6 of the second interconnect 12. The lower face $S_{2B}$ is an example of a second lower face. The upper face $S_{2C}$ corresponds to an upper face of the second interconnect 12. The lower face $S_{2B}$ of the present embodiment is set lower than the lower face $S_{1B}$. The upper face $S_{2C}$ of the present embodiment is set at substantially the same height as the upper face $S_{1C}$. The thickness $T_{2B}$ of the present embodiment is set greater than the thickness $T_{1B}$. The thicknesses $T_{1B}$ and $T_{2B}$ of the present embodiment are 40 nm and 55 nm, respectively.

The sidewall insulator 5 is formed on the side faces of the upper interconnect layer 6 of each interconnect 11, 12. An example of the sidewall insulator 5 is a silicon oxide film. The sidewall insulator 5 of the present embodiment is a remnant of a sacrificial insulator used for forming the upper interconnect layer 6 by the damascene process. The sidewall insulator 5 of the present embodiment may be completely removed after the upper interconnect layer 6 is formed by the damascene process.

The upper insulator 7 is formed so as to cover the first and second interconnects 11 and 12 on the substrate 1. The upper insulator 7 of the present embodiment is formed on the upper faces $S_{1C}$ and side faces of the first interconnects 11, on the upper face $S_{2C}$ and side faces of the second interconnect 12, and on the bottom faces $S_{1D}$ and $S_{2D}$ of the trenches that are adjacent to the first and second interconnects 11 and 12.

Since the upper insulator 7 of the present embodiment is directly formed on the upper interconnect layer 6, the upper insulator 7 is formed of a material that has a barrier property with respect to metallic atoms in the upper interconnect layer 6 (e.g., Cu atoms). Examples of such an upper insulator 7 are a silicon nitride (SiN) film, a silicon carbide (SiC) film, and a silicon carbonitride (SiCN) film.

As shown in FIG. 1C, the upper insulator 7 of the present embodiment may be formed such that air gaps 7a are formed adjacent to the first interconnects 11 under the upper insulator 7. FIG. 1C shows the air gaps 7a formed between the first interconnects 11 so as to be surrounded by the upper insulator 7. Reference character's $P_A$ and $P_B$ denote the lower ends and the upper ends of the air gaps 7a, respectively. The air gaps 7a of the present embodiment are desirably formed such that the lower ends $P_A$ of the air gaps 7a become lower than the lower faces $S_{1A}$ of the first interconnects 11.

(1) Structure of Semiconductor Device of First Embodiment

The structure of the semiconductor device of the first embodiment will be described in detail with reference to FIGS. 1A to 1C.

Each of the first and second interconnects 11 and 12 of the present embodiment is a composite interconnect including the lower interconnect layer 4 formed by RIE and the upper interconnect layer 6 formed by the damascene process. The lower interconnect layer 4 of the present embodiment correspond to a RIE interconnect, and the upper interconnect layer 6 of the present embodiment correspond to a damascene interconnect.

In general, the damascene interconnect is limited in interconnect thickness due to the embedding limit of the interconnect material (e.g., copper). However, since the first and second interconnects 11 and 12 in the present embodiment includes RIE interconnects and damascene interconnects, the first and second interconnects 11 and 12 can be formed to have thicknesses beyond such limitation. Therefore, the present embodiment allows the resistances of the first and second interconnects 11 and 12 to be reduced as compared with the damascene interconnects. Also, the present embodiment makes it possible, by forming the upper interconnect layer 6 with copper, to reduce the resistances of the first and second interconnects 11 and 12 as compared with the RIE interconnects.

In addition, the present embodiment allows the air gaps 7a to be formed between the first interconnects 11. Therefore, the present embodiment makes it possible to reduce not only the resistances of the first interconnects 11 but also the capacitances between the first interconnects 11. Furthermore, the present embodiment makes it possible, by making the lower ends $P_A$ of the air gaps 7a lower than the lower faces $S_{1A}$ of the first interconnects 11, to increase the volumes of the air gaps 7a, thereby reducing the capacitances between the first interconnects 11.

Also, in the present embodiment, the lower face $S_{2B}$ of the upper interconnect layer 6 of the second interconnect 12 is set lower than the lower face $S_{1B}$ of the upper interconnect layer 6 of the first interconnects 11. Therefore, the present embodiment makes it possible to make the ratio of the upper interconnect layer 6 in the second interconnect 12 higher than the ratio of the upper interconnect layer 6 in the first interconnects 11.

Accordingly, the present embodiment can increase the ratio of the copper interconnect layer in the second interconnect 12, thereby effectively reducing the resistance of the second interconnect 12 that has a demand for restricting interconnect delays by reducing the interconnect resistance. In addition, the present embodiment makes it possible, by making the lower face $S_{1B}$ of the upper interconnect layer 6 of the first interconnects 11 higher than the lower face $S_{2B}$ of the upper interconnect layer 6 of the second interconnect 12, to prevent the interconnect thicknesses of the upper interconnect layer 6 of the first interconnects 11 from exceeding the above limitation.

It is noted that the structure in which the lower face $S_{2B}$ is lower than the lower face $S_{1B}$ can be realized, for example, by the loading effect when first and second openings 13 and 14 to be described later are formed in a sacrificial insulator (sidewall insulator) 5.

(2) Method of Manufacturing Semiconductor Device of First Embodiment

Figure 2A:
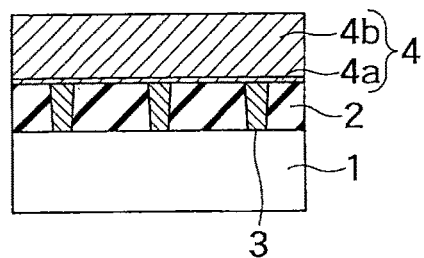
FIGS. 2A to 7B are cross sectional views showing a method of manufacturing the semiconductor device of the first embodiment.

FIGS. 2A to 7B are cross sectional views showing a method of manufacturing the semiconductor device of the first embodiment. FIG. 2A shows the memory cell region as similar to FIG. 1A. FIG. 2B shows the peripheral circuit region as similar to FIG. 1B. These are also applied to FIGS. 3A to 7B.

Figure 2B:
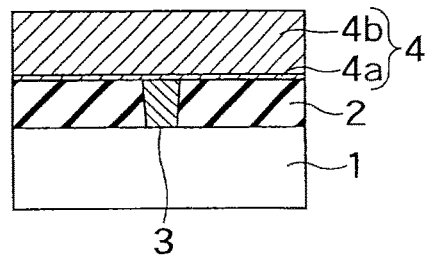

First, the lower insulator 2 is formed on the substrate 1, the via plugs 3 are formed in the lower insulator 2, and the barrier metal layer 4a and the interconnect material layer 4b of the lower interconnect layer 4 are formed on the lower insulator 2 and the via plugs 3 (FIGS. 2A and 2B). An example of the barrier metal layer 4a is a Ti layer having a thickness of 5 nm. An example of the interconnect material layer 4b is a W layer having a thickness of 40 nm.

Figure 3A:
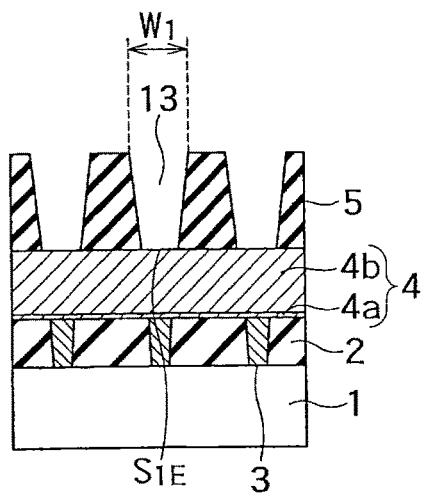
Figure 3B:
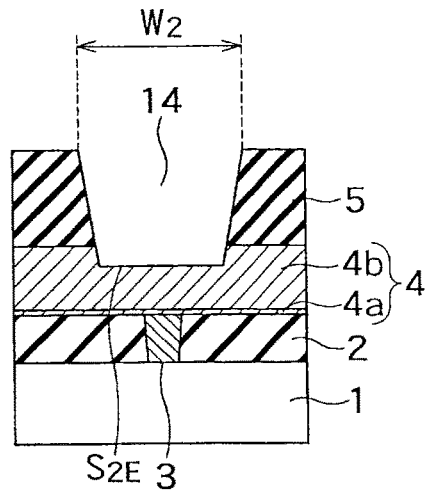

Next, the sacrificial insulator (sidewall insulator) 5 is formed on the lower interconnect layer 4 (FIGS. 3A and 3B). An example of the sacrificial insulator 5 is a silicon oxide film having a thickness of 80 nm. Next, the first and second openings 13 and 14 are formed in the sacrificial insulator 5 by lithography and RIE (FIGS. 3A and 3B). As a result, the lower interconnect layer 4 is exposed in the first and second openings 13 and 14.

The first openings 13 are formed in the memory cell region and used for embedding upper interconnect layer 6 of the first interconnects 11. The first openings 13 of the present embodiment extend in the Y direction and have the first width $W_1$ in the X direction.

The second opening 14 is formed in the peripheral circuit region and used for embedding the upper interconnect layer 6 of the second interconnect 12. The second opening 14 of the present embodiment extends in various directions and has the second width $W_2$. FIG. 3B shows a portion of the second opening 14 extending in the Y direction. This portion has the second width $W_2$ in the X direction.

The second width $W_2$ of the present embodiment is set greater than the first width $W_1$. Therefore, the present embodiment can make a bottom face $S_{2E}$ of the second opening 14 lower than bottom faces $S_{1E}$ of the first openings 13 by using the loading effect in RIE. The depth of the first openings 13 is 80 nm in the present embodiment. The depth of the second opening 14 is 95 nm in the present embodiment.

Figure 4A:
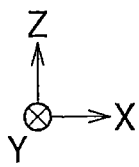
Figure 4A:
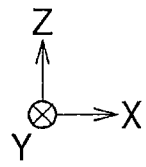
Figure 4A:
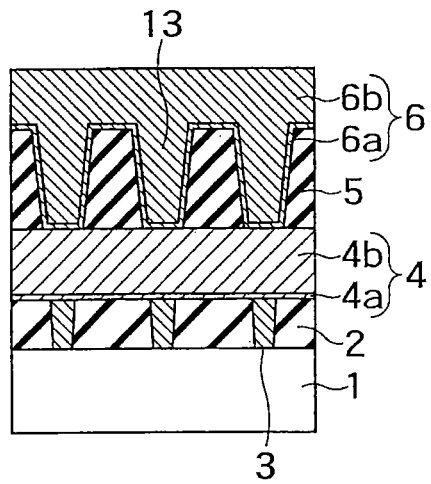
Figure 4B:
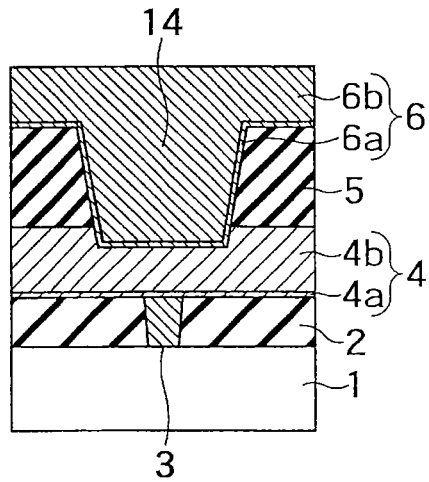

Next, the barrier metal layer 6a and the interconnect material layer 6b of the upper interconnect layer 6 are formed over the whole surface of the substrate 1 (FIGS. 4A and 4B). As a result, the barrier metal layer 6a are formed on the bottom faces $S_{1E}$ and $S_{2E}$ and side faces of the first and second openings 13 and 14, and the interconnect material layers 6b are formed in the first and second openings 13 and 14 via the barrier metal layers 6a. An example of the barrier metal layer 6a is a Ti layer having a thickness of 8 nm. An example of the interconnect material layer 6b is a Cu layer having a thickness of 350 nm.

Figure 5A:
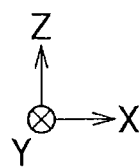
Figure 5A:
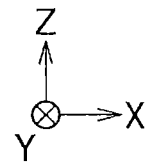
Figure 5A:
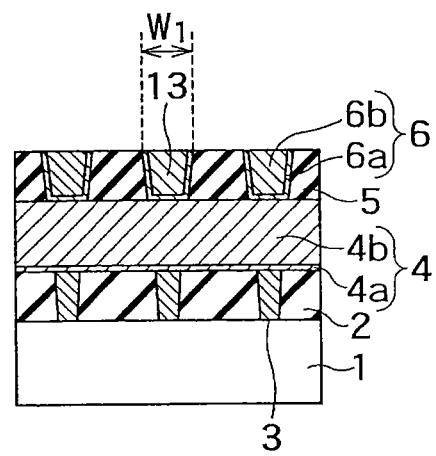
Figure 5B:
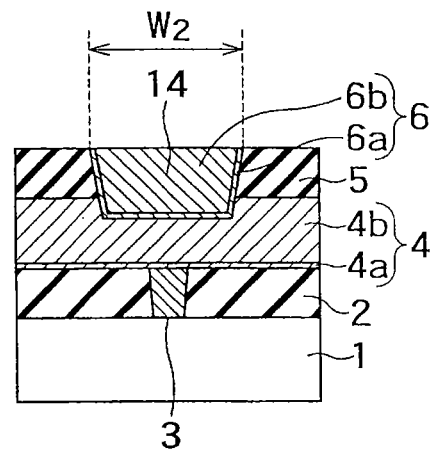

Next, the surface of the upper interconnect layer 6 is planarized by chemical mechanical polishing (CMP) (FIGS. 5A and 5B). As a result, the upper interconnect layer 6 outside the first and second openings 13 and 14 is removed, and the upper interconnect layer 6 in the first and second openings 13 and 14 is left on the lower interconnect layer 4. The upper interconnect layer 6 in the first openings 13 is an example of the second layer. The upper interconnect layer 6 in the second openings 14 is an example of the fourth layer.

In the present embodiment, to prevent a short circuit between the first interconnects 11 and a short circuit between second interconnects 12, it is also desired to perform the CMP to remove portions of the sacrificial insulator 5. In the present embodiment, the CMP is continued until the thickness of the sacrificial insulator 5 becomes 40 nm. As a result, the thickness of the upper interconnect layer 6 in the first openings 13 becomes 40 nm, and the thickness of the upper interconnect layer 6 in the second opening 14 becomes 55 nm.

Figure 6A:
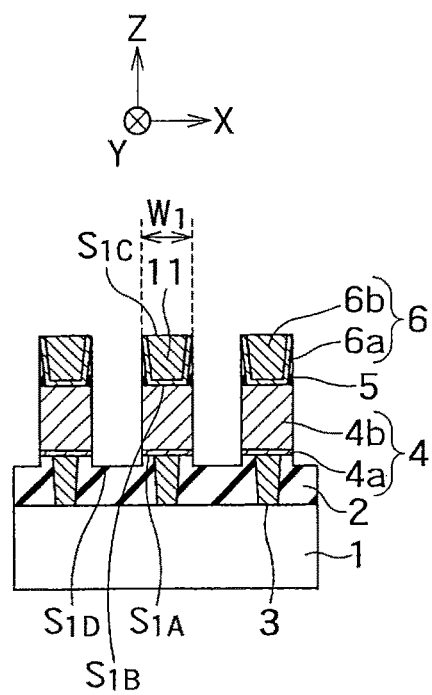
Figure 6B:
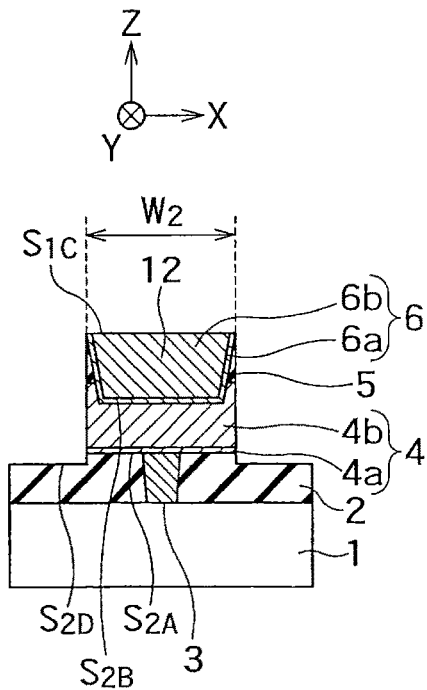

Next, trenches that penetrate the lower interconnect layer 4 and the sacrificial insulator 5 to reach the lower insulator 2 are formed by dry etching using the upper interconnect layer 6 as a mask (FIGS. 6A and 6B). As a result, the first and second interconnects 11 and 12 including the lower interconnect layer 4 and the upper interconnect layer 6 are formed in a self-aligned manner. The lower interconnect layer 4 of the first interconnects 11 is an example of the first layer. The lower interconnect layer 4 of the second interconnect 12 is an example of the third layer. The above-described dry etching is, for example, RIE.

The dry etching of the present embodiment also removes portions of the lower insulator 2. As a result, the bottom faces $S_{1D}$ and $S_{2D}$ of the trenches that are adjacent to the first and second interconnects 11 and 12 are made lower than the lower faces $S_{1A}$ and $S_{2A}$ of the first and second interconnects. The lower ends $P_A$ of the air gaps 7a therefore can be made lower than the lower faces $S_{1A}$ of the first interconnects 11 when the air gaps 7a are formed between the first interconnects 11.

In the present embodiment, misalignment occurring in the lithography in forming the first and second openings 13 and 14 may cause the via plugs 3 to be exposed from the lower interconnect layer 4 in the dry etching for the first and second interconnects 11 and 12. However, when the portions of the lower insulator 2 are removed in the dry etching of the present embodiment, exposed portions of the via plugs 3 are removed together with the portions of the lower insulator 2. Therefore, the present embodiment can prevent the short circuit between the first interconnects 11 through the exposed portions of the via plugs 3 and the short circuit between the second interconnects 12 through the exposed portions of the via plugs 3. Furthermore, the present embodiment can prevent the increase of a capacitance between an exposed portion of a via plug 3 and its adjacent first interconnect 11 and the increase of a capacitance between an exposed portion of a via plug 3 and its adjacent second interconnect 12.

In the present embodiment, the sacrificial insulator 5 may be left on the side faces of the upper interconnect layer 6 after the dry etching for the first and second interconnects 11 and 12. The sacrificial insulator 5 is likely to be left when the taper angles of the first and second openings 13 and 14 are small.

Figure 7A:
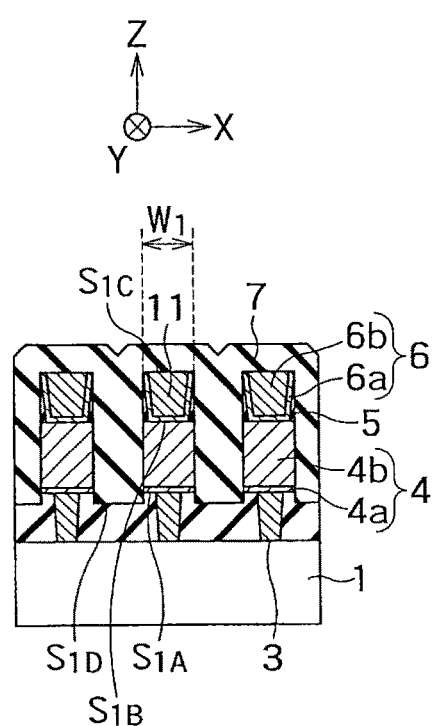
Figure 7B:
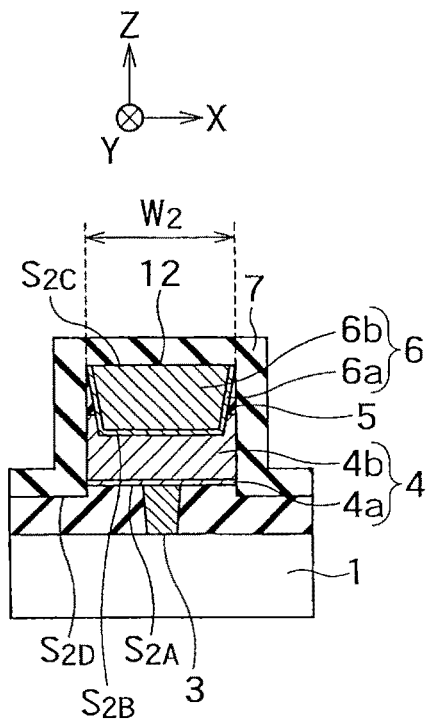

Next, the upper insulator 7 is formed over the whole surface of the substrate 1 (FIGS. 7A and 7B). As a result, the first and second interconnects 11 and 12 are covered with the upper insulator 7. An example of the upper insulator 7 is a silicon carbonitride film having a thickness of 70 nm. The upper insulator 7 is formed, for example, by chemical vapor deposition (CVD).

The upper insulator 7 of the present embodiment may be formed under a film formation condition that brings poor coatability. This enables the air gaps 7a to be formed between the first interconnects 11 under the upper insulator 7 (refer to FIG. 1C).

Thereafter, various inter layer dielectrics, interconnect layers, via plugs and the like are formed on the substrate 1. In this way, the semiconductor device of the present embodiment is manufactured.

As described above, the first and second interconnects 11 and 12 of the present embodiment are formed by forming the sacrificial insulator 5 on the first interconnect layer 4, forming the second interconnect layer 6 in the sacrificial insulator 5, and etching the first interconnect layer 4 using the second interconnect layers 6 as a mask. Therefore, the present embodiment makes it possible to form the composite interconnects as the first and second interconnects 11 and 12, which can reduce the resistances of the first and second interconnects 11 and 12.

In addition, when the first and second openings 13 and 14 are formed in the present embodiment, the bottom face $S_{2E}$ of the second opening 14 is made lower than the bottom faces $S_{1E}$ of the first openings 13. Therefore, the present embodiment makes it possible to make the lower face $S_{2B}$ of the upper interconnect layer 6 of the second interconnect 12 lower than the lower face $S_{1B}$ of the upper interconnect layers 6 of the first interconnects 11, which can effectively reduce the resistance of the second interconnect 12.

Second Embodiment

Figure 8A:
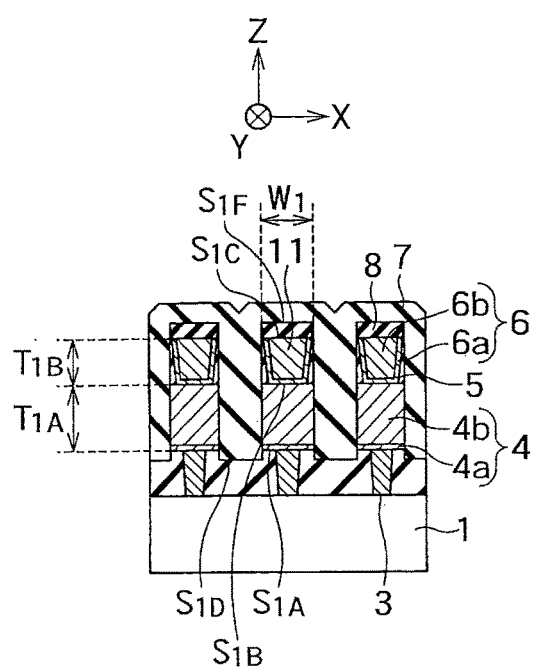
FIGS. 8A to 8C are cross sectional views showing a structure of a semiconductor device of a second embodiment.
Figure 8B:
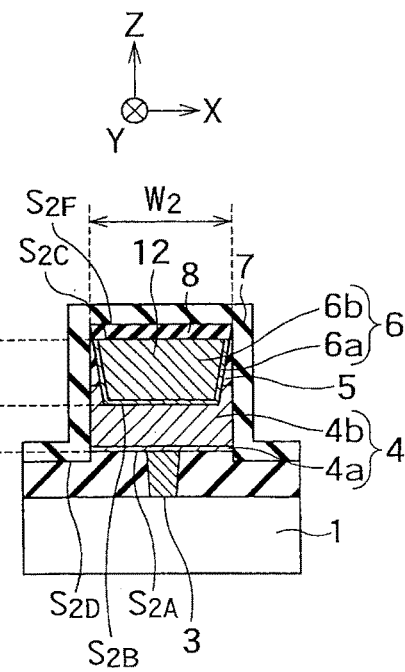
Figure 8C:
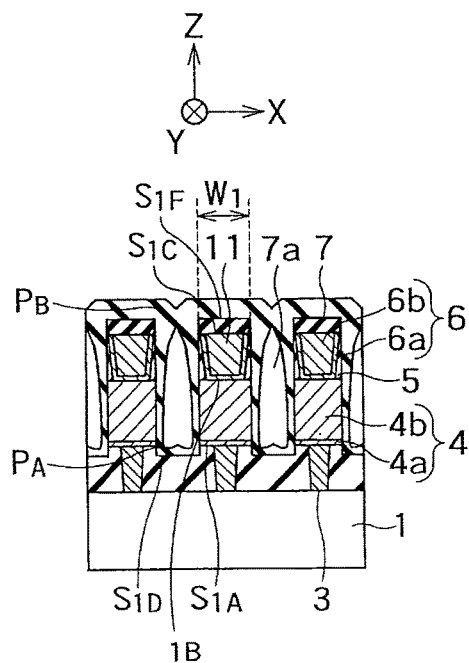

FIGS. 8A to 8C are cross sectional views showing a structure of a semiconductor device of a second embodiment. In the description of the present embodiment, explanation of matters common to the first embodiment will be omitted.

As shown in FIGS. 8A and 8B, the semiconductor device of the present embodiment includes a cap insulator 8 formed on the first and second interconnects 11 and 12. The cap insulator 8 is an example of a second insulator and a second film. The upper insulator 7 of the present embodiment is formed on the first and second interconnects 11 and 12 via the cap insulator 8. In addition, the sidewall insulator 5 of the present embodiment is formed on the side faces of the upper interconnect layer 6 and on side faces of the cap insulator 8 of each interconnect 11, 12.

The cap insulator 8 on the first interconnects 11 are used as a mask for processing the first interconnects 11 by etching. Therefore, the cap insulator 8 on the first interconnects 11 have the first width $W_1$ as similar to the first interconnects 11. The cap insulator 8 on the first interconnect 11 is an example of a fifth layer.

Similarly, the cap insulator 8 on the second interconnect 12 is used as a mask for processing the second interconnect 12 by etching. Therefore, the cap insulator 8 on the second interconnect 12 has the second width $W_2$ as similar to the second interconnect 12. The cap insulator 8 on the second interconnect 12 is an example of a sixth layer.

FIG. 8A shows an upper face $S_{1F}$ of the cap insulator 8 on the first interconnects 11. FIG. 8B shows an upper face $S_{2F}$ of the cap insulator 8 on the second interconnect 12. The upper face $S_{2F}$ of the present embodiment is set at substantially the same height as the upper faces $S_{1F}$.

Since the cap insulator 8 of the present embodiment is directly formed on the upper interconnect layer 6, the cap insulator 8 is formed of a material that has a barrier property with respect to metallic atoms in the upper interconnect layer 6 (e.g., Cu atoms). Examples of such cap insulator 8 are a silicon nitride film, a silicon carbide film and a silicon carbonitride film.

In contrast, since the upper insulator 7 of the present embodiment is formed on the upper interconnect layers 6 via the cap insulator 8, the upper insulator 7 of the present embodiment has no need to be formed of the material that has the barrier property with respect to the metallic atoms in the upper interconnect layers 6. An example of such an upper insulator 7 is a silicon oxide film.

As shown in FIG. 8C, the upper insulator 7 of the present embodiment may be formed such that the air gaps 7a are formed adjacent to the first interconnects 11 under the upper insulator 7. FIG. 8C shows the air gaps 7a formed between the first interconnects 11 so as to be surrounded by the upper insulator 7. The air gaps 7a of the present embodiment are desirably formed such that the lower ends $P_A$ of the air gaps 7a become lower than the lower faces $S_{1A}$ of the first interconnects 11. In addition, the air gaps 7a of the present embodiment are desirably formed such that the upper ends $P_B$ of the air gaps 7a become higher than the upper faces $S_{1C}$ of the first interconnects 11.

FIGS. 9A to 14B are cross sectional views showing a method of manufacturing the semiconductor device of the second embodiment.

Figure 9A:
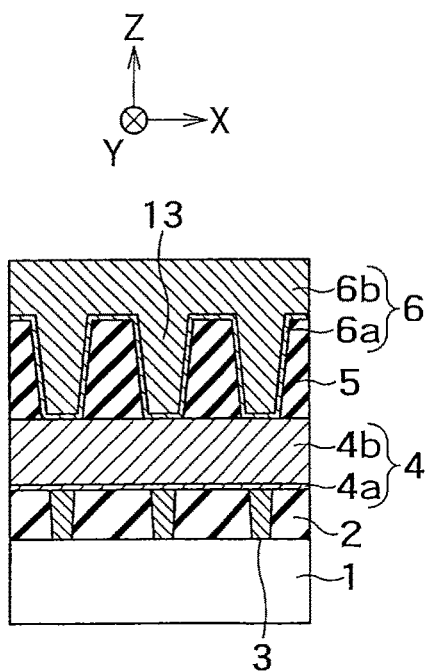
FIGS. 9A to 14B are cross sectional views showing a method of manufacturing the semiconductor device of the second embodiment.
Figure 9B:
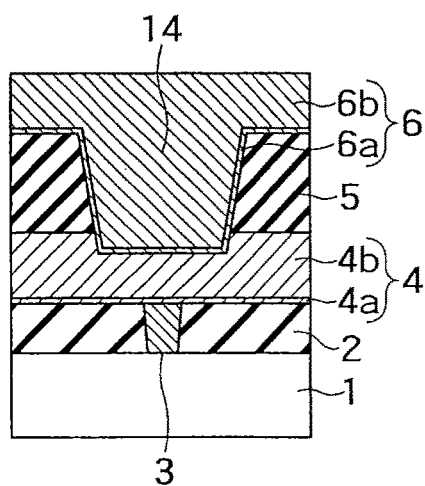

First, the processes of FIGS. 2A to 4B are performed. As a result, a structure shown in FIGS. 9A and 9B is formed. Note that the thickness of the sacrificial insulator 5 is 95 nm in the present embodiment. In addition, the depth of the first openings 13 is 95 nm, and the depth of the second opening 14 is 110 nm.

Figure 10A:
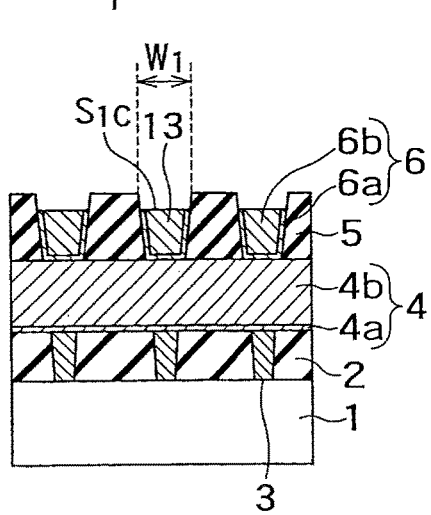
Figure 10B:
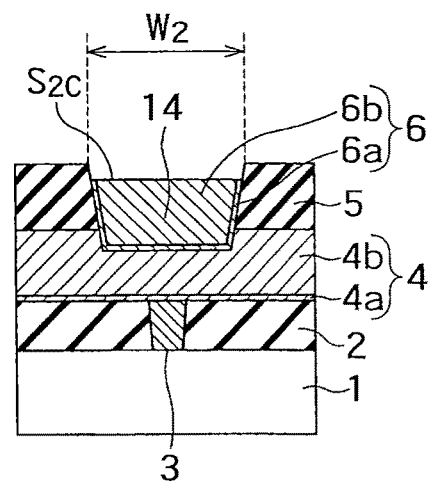

Next, the surface of the upper interconnect layer 6 is planarized by CMP (FIGS. 10A and 10B). As a result, the upper interconnect layer 6 outside the first and second openings 13 and 14 is removed, and the upper interconnect layer 6 in the first and second openings 13 and 14 is left on the lower interconnect layer 4. In the present embodiment, the CMP is continued until the thickness of the sacrificial insulator 5 becomes 55 nm.

In the CMP of the present embodiment, a CMP condition is set such that the upper faces $S_{1C}$ and $S_{2C}$ of the upper interconnect layer 6 in the first and second openings 13 and 14 are made lower than the upper face of the sacrificial insulator 5. Specifically, the CMP condition is set such that the polishing rate of the interconnect material layer 6b of the upper interconnect layer 6 is made higher than the polishing rate of the sacrificial insulator 5. As a result, portions of the upper interconnect layer 6 in the first and second openings 13 and 14 are removed, and the upper faces $S_{1C}$ and $S_{2C}$ of the upper interconnect layer 6 in the first and second openings 13 and 14 are made lower than the upper face of the sacrificial insulators 5.

When the portions of the upper interconnect layer 6 in the first and second openings 13 and 14 are removed, the barrier metal layer 6a above the upper faces $S_{1C}$ and $S_{2C}$ of the upper interconnect layer 6 may be left on the side faces of the first and second openings 13 and 14.

The CMP of the present embodiment is performed such that the upper faces $S_{1C}$ and $S_{2C}$ of the upper interconnect layer 6 become 15 nm lower than the upper face of the sacrificial insulator 5. As a result, the thickness of the upper interconnect layer 6 in the first openings 13 becomes 40 nm, and the thickness of the upper interconnect layer 6 in the second opening 14 becomes 55 nm.

In the processes of FIGS. 10A and 10B, the CMP may be performed such that the upper faces $S_{1C}$ and $S_{2C}$ of the upper interconnect layer 6 in the first and second openings 13 and 14 become at the same height as the upper face of the sacrificial insulators 5, and thereafter the upper faces $S_{1C}$ and $S_{2C}$ of the upper interconnect layer 6 may be recessed by wet etching. As a result, the portions of the upper interconnect layer 6 in the first and second openings 13 and 14 are removed, and the upper faces $S_{1C}$ and $S_{2C}$ of the upper interconnect layer 6 in the first and second openings 13 and 14 are made lower than the upper face of the sacrificial insulator 5. Examples of a chemical solution for the wet etching include an inorganic acid such as a concentrated sulfuric acid, a hydrochloric acid and a nitric acid, and an organic liquid such as an ethylenediamine and a choline.

Figure 11A:
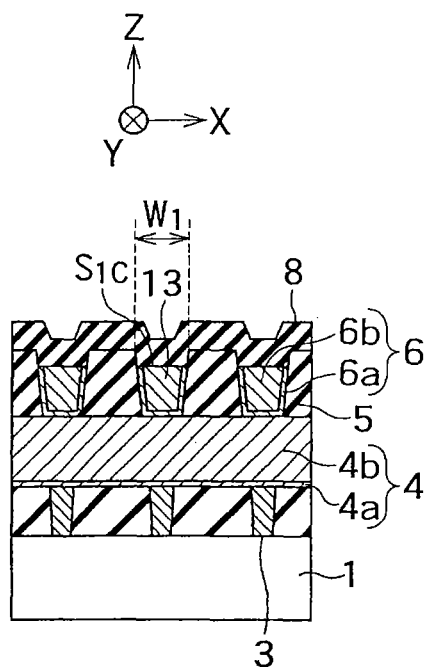
Figure 11B:
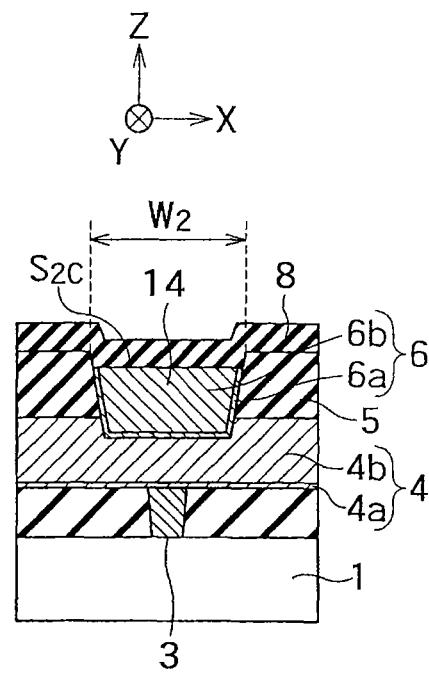

Next, the cap insulator 8 is formed over the whole surface of the substrate 1 (FIGS. 11A and 11B). As a result, the cap insulator 8 is formed on the upper interconnect layer 6 in the first and second openings 13 and 14. An example of the cap insulator 8 is a silicon nitride film having a thickness of 30 nm.

Figure 12A:
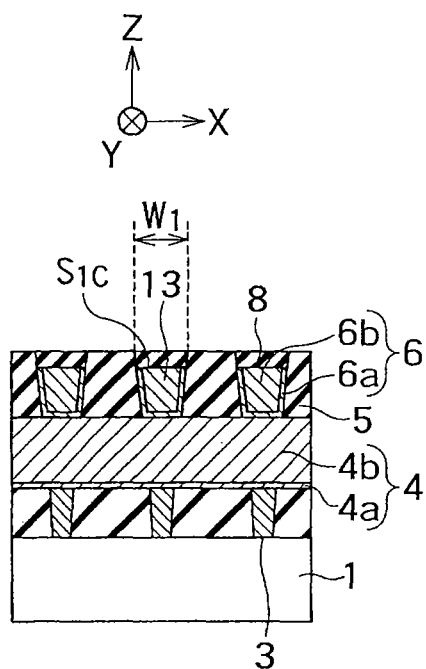
Figure 12B:
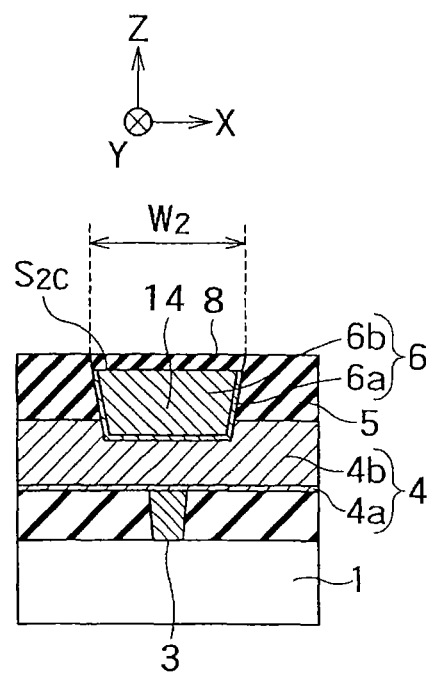

Next, the surface of the cap insulator 8 is planarized by CMP (FIGS. 12A and 12B). As a result, the cap insulator 8 outside the first and second openings 13 and 14 is removed, and the cap insulator 8 is left in a self-aligned manner on the upper interconnect layers 6 in the first and second openings 13 and 14. The CMP in this process is continued until the sacrificial insulator 5 is exposed.

Figure 13A:
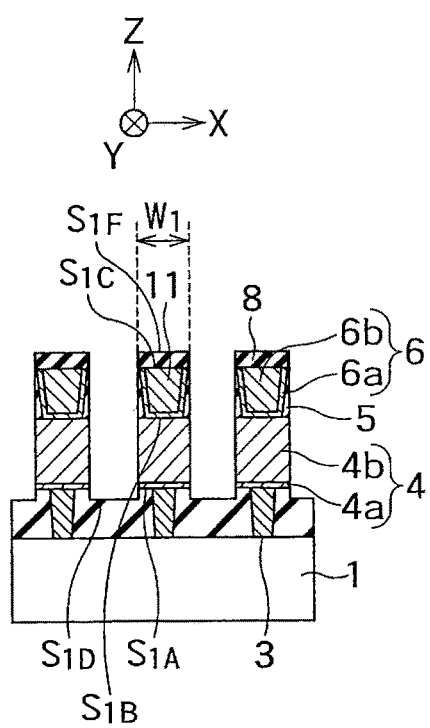
Figure 13B:
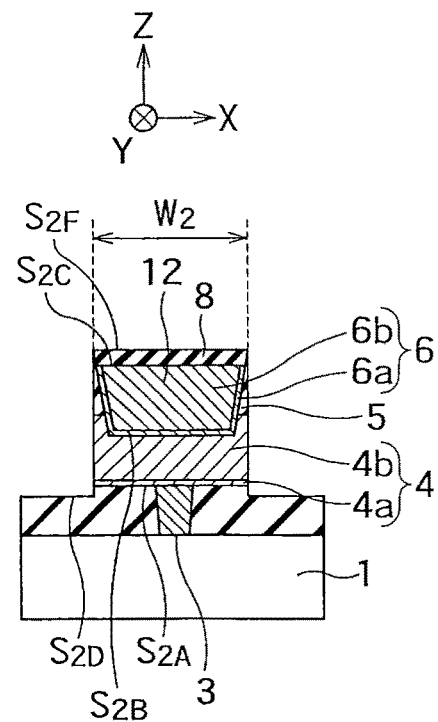

Next, trenches that penetrate the sacrificial insulator 5 and the lower interconnect layer 4 to reach the lower insulator 2 are formed by dry etching using the cap insulator 8 as a mask (FIGS. 13A and 13B). As a result, the first and second interconnects 11 and 12 including the lower interconnect layer 4 and the upper interconnect layer 6 are formed in a self-aligned manner.

Figure 14A:
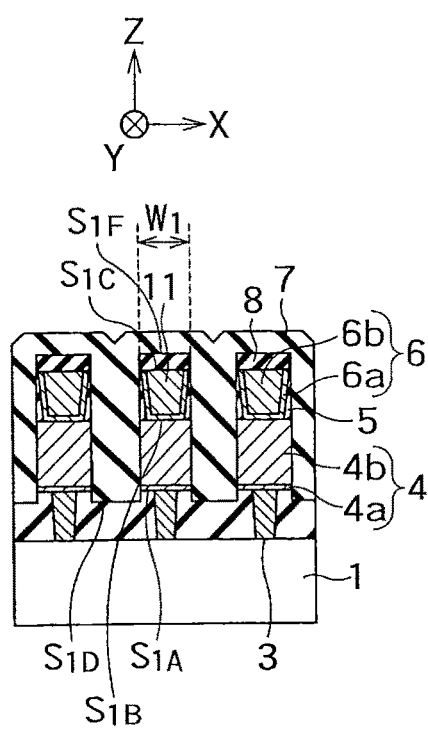
Figure 14B:
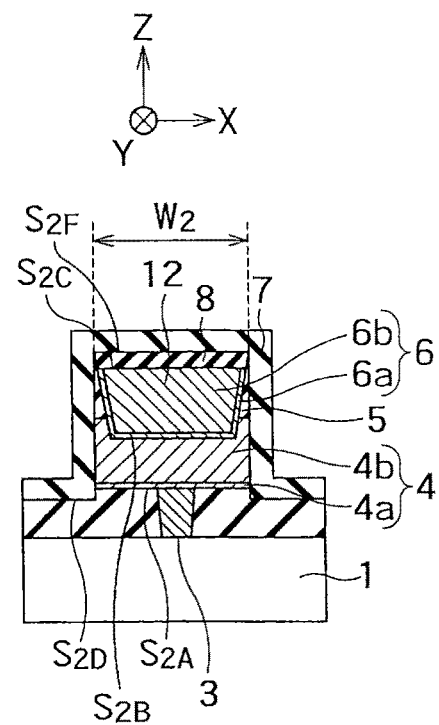

Next, the upper insulator 7 is formed over the whole surface of the substrate 1 (FIGS. 14A and 14B). As a result, the first and second interconnects 11 and 12 are covered with the upper insulator 7 via the cap insulator 8. An example of the upper insulator 7 is a silicon oxide film having a thickness of 70 nm.

The upper insulator 7 of the present embodiment may be formed under a film formation condition that brings poor coatability. This enables the air gaps 7a to be formed between the first interconnects 11 under the upper insulator 7 (refer to FIG. 8C). In the present embodiment, the upper insulator 7 is formed in a state where the cap insulator 8 is present on the first interconnects 11, which allows the upper ends $P_B$ of the air gaps 7a to be made higher than the upper faces $S_{1C}$ of the first interconnects 11. This enables the volumes of the air gaps 7a to be increased, enabling the further reduction of the capacitances between the first interconnects 11.

Thereafter, various inter layer dielectrics, interconnect layers, via plugs and the like are formed on the substrate 1. In this way, the semiconductor device of the present embodiment is manufactured.

As described above, the first and second interconnects 11 and 12 of the present embodiment are formed by forming the sacrificial insulator 5 on the first interconnect layer 4, forming the second interconnect layer 6 and the cap insulator 8 in the sacrificial insulator 5, and etching the first interconnect layer 4 using the cap insulator 8 as a mask.

Therefore, the present embodiment makes it possible, as similar to the first embodiment, to form the composite interconnects as the first and second interconnects 11 and 12, which can reduce the resistances of the first and second interconnects 11 and 12.

In addition, the present embodiment makes it possible, by etching the first interconnect layer 4 using the cap insulator 8 as a mask, to inhibit the etching from damaging the second interconnect layer 6.

Third Embodiment

Figure 15A:
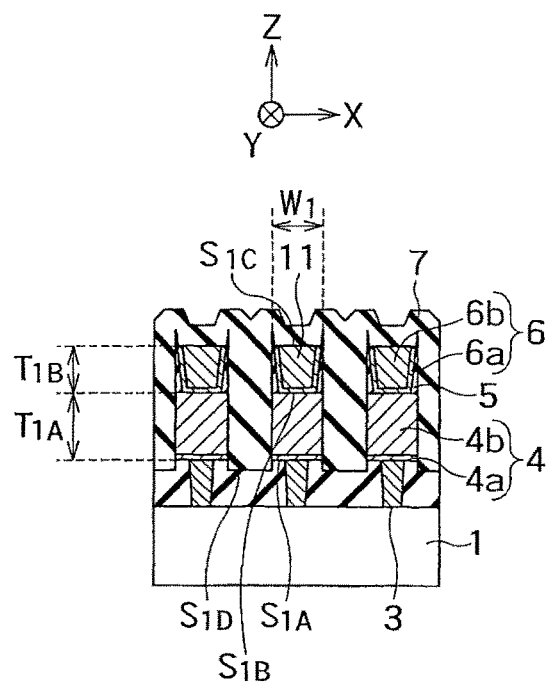
FIGS. 15A to 15C are cross sectional views showing a structure of a semiconductor device of a third embodiment.
Figure 15B:
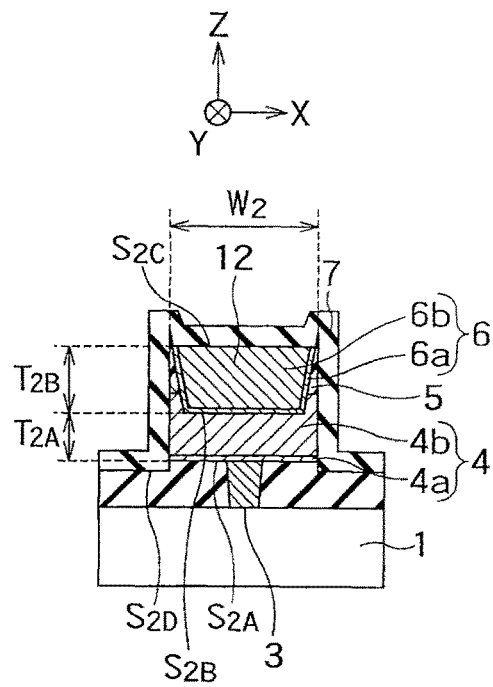
Figure 15C:
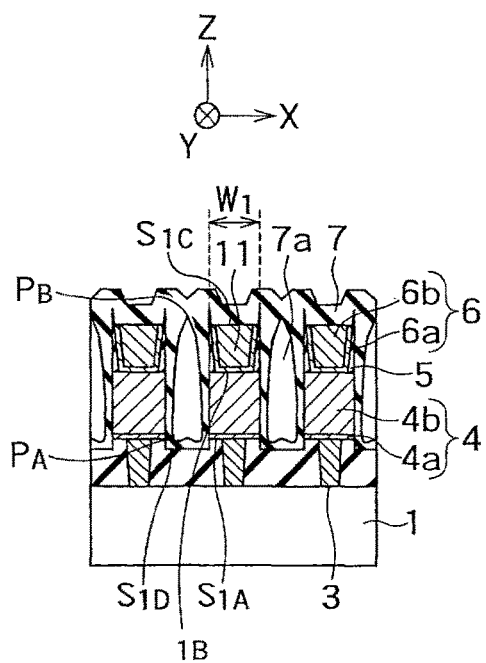

FIGS. 15A to 15C are cross sectional views showing a structure of a semiconductor device of a third embodiment. In the description of the present embodiment, explanation of matters common to the first or second embodiment will be omitted.

As shown in FIG. 15A, the first interconnects 11 of the present embodiment have the upper faces $S_{1C}$ that are lower than the upper end of the sidewall insulator 5. As shown in FIG. 15B, the second interconnect 12 of the present embodiment has the upper face $S_{2C}$ that is lower than the upper end of the sidewall insulator 5. The upper face $S_{2C}$ of the present embodiment is set at substantially the same height as the upper faces $S_{1C}$.

Since the upper insulator 7 of the present embodiment is directly formed on the upper interconnect layer 6 as similar to the first embodiment, the upper insulator 7 of the present embodiment is formed of a material that has a barrier property with respect to metallic atoms in the upper interconnect layer 6 (e.g., Cu atoms). Examples of such upper insulator 7 are a silicon nitride film, a silicon carbide film and a silicon carbonitride film.

As shown in FIG. 15C, the upper insulator 7 of the present embodiment may be formed such that the air gaps 7a are formed adjacent to the first interconnects 11 under the upper insulator 7. FIG. 15C shows the air gaps 7a formed between the first interconnects 11 so as to be surrounded by the upper insulator 7. The air gaps 7a of the present embodiment are desirably formed such that the lower ends $P_A$ of the air gaps 7a become lower than the lower faces $S_{1A}$ of the first interconnects 11, and the upper ends $P_B$ of the air gaps 7a becomes higher than the upper faces $S_{1C}$ of the first interconnects 11.

FIGS. 16A to 21B are cross sectional views showing a method of manufacturing the semiconductor device of the third embodiment.

Figure 16A:
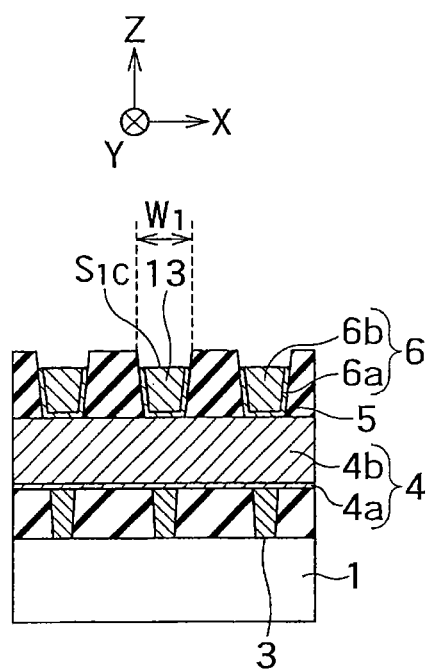
Figure 16B:
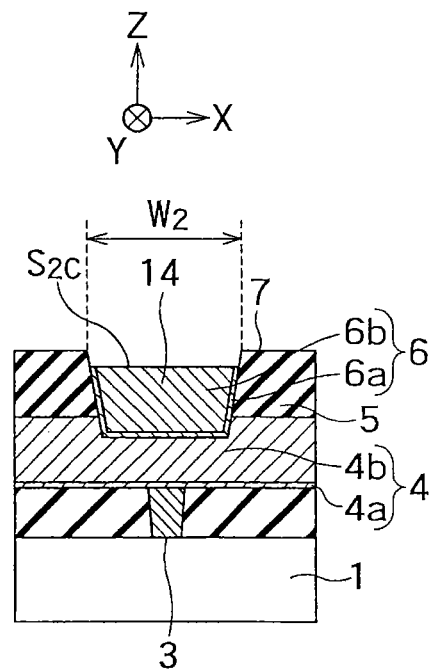

First, the processes of FIGS. 9A to 10B are performed. As a result, a structure shown in FIGS. 16A and 16B is formed. Note that the thickness of the sacrificial insulator 5 of FIGS. 16A and 16B is 55 nm. In addition, the upper faces $S_{1C}$ and $S_{2C}$ of the upper interconnect layer 6 is made 15 nm lower than the upper face of the sacrificial insulator 5, the thickness of the upper interconnect layer 6 in the first openings 13 is 40 nm, and the thickness of the upper interconnect layer 6 in the second opening 14 is 55 nm.

Figure 17A:
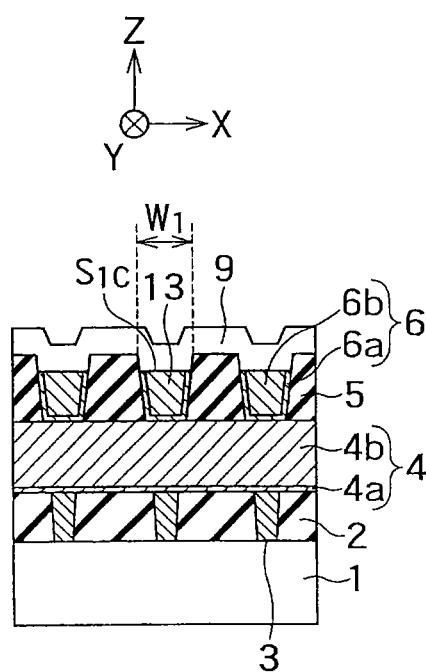
Figure 17B:
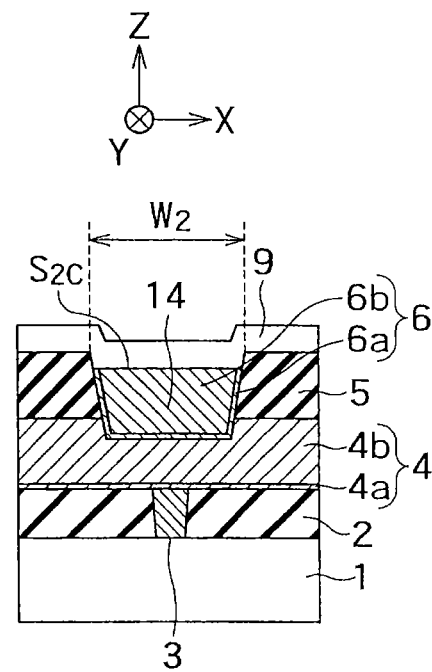

Next, an organic film 9 is formed over the whole surface of the substrate 1 (FIGS. 17A and 17B). As a result, the organic film 9 is formed on the upper interconnect layer 6 in the first and second openings 13 and 14. The organic film 9 is an example of the second film. An example of the organic film 9 is an organic insulator (e.g., a photoresist film) having a thickness of 30 nm.

Figure 18A:
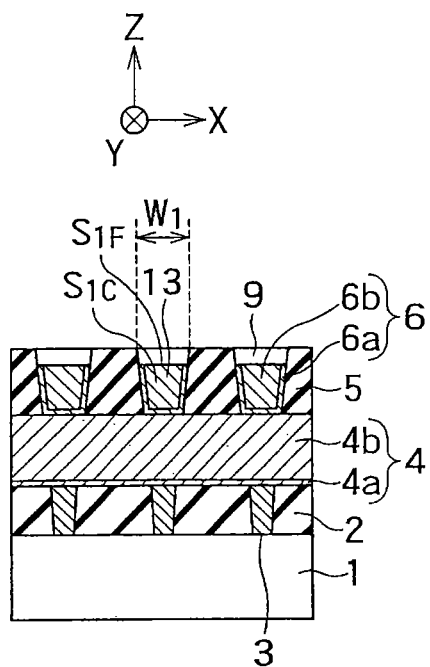
Figure 18B:
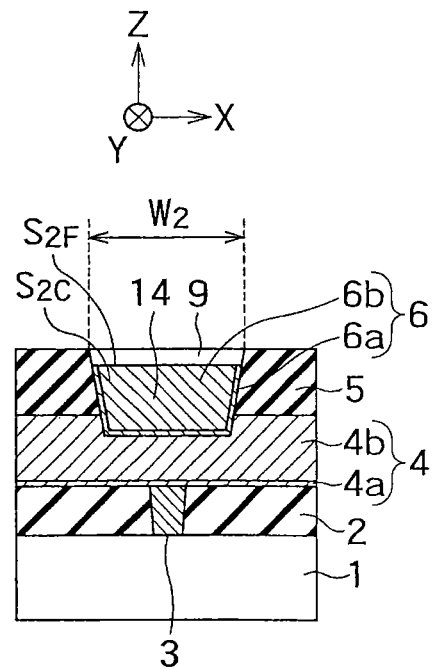

Next, the surface of the organic film 9 is planarized by CMP (FIGS. 18A and 18B). As a result, the organic film 9 outside the first and second openings 13 and 14 is removed, and the organic film 9 in the first and second openings 13 and 14 is left in a self-aligned manner on the upper interconnect layer 6. The CMP in this process is continued until the sacrificial insulator 5 is exposed.

Figure 19A:
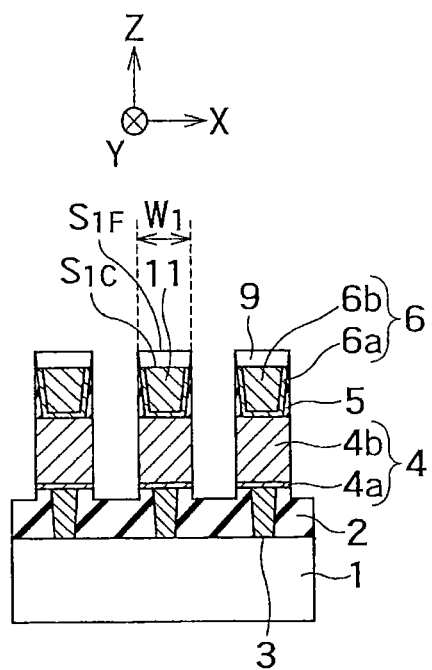
Figure 19B:
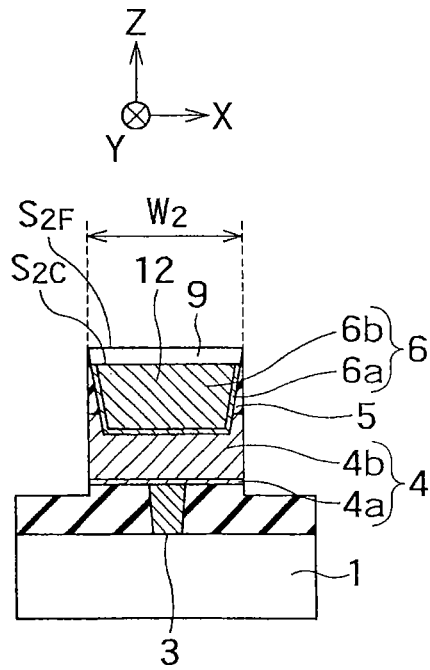

Next, trenches that penetrate the sacrificial insulator 5 and the lower interconnect layer 4 to reach the lower insulator 2 are formed by dry etching using the organic film 9 as a mask (FIGS. 19A and 19B). As a result, the first and second interconnects 11 and 12 including the lower interconnect layer 4 and the upper interconnect layer 6 are formed in a self-aligned manner.

The dry etching of the present embodiment is performed such that the sacrificial insulator 5 is left on the side faces of the upper interconnect layer 6 after the dry etching. The sacrificial insulator 5 is likely to be left when the taper angles of the first and second openings 13 and 14 are small.

Next, the organic film 9 is removed by ashing or wet etching (FIGS. 20A and 20B). FIGS. 20A and 20B show the first and second interconnects 11 and 12 having the upper faces $S_{1C}$ and $S_{2C}$ that are lower than the upper end of the sidewall insulator 5.

Next, the upper insulator 7 is formed over the whole surface of the substrate 1 (FIGS. 21A and 21B). As a result, the first and second interconnects 11 and 12 are covered with the upper insulator 7. An example of the upper insulator 7 is a silicon carbonitride film having a thickness of 70 nm.

The upper insulator 7 of the present embodiment may be formed under a film formation condition that brings poor coatability. This enables the air gaps 7a to be formed between the first interconnects 11 under the upper insulator 7 (refer to FIG. 15C). In the present embodiment, the upper insulator 7 is formed in a state where the upper end of the sidewall insulator 5 is higher than the upper faces $S_{1C}$ and $S_{2C}$ of the first and second interconnects 11 and 12, which allows the upper ends $P_B$ of the air gaps 7a to be made higher than the upper faces $S_{1C}$ of the first interconnects 11. This enables the volumes of the air gaps 7a to be increased, enabling the further reduction of the capacitances between the first interconnects 11.

Thereafter, various inter layer dielectrics, interconnect layers, via plugs and the like are formed on the substrate 1. In this way, the semiconductor device of the present embodiment is manufactured.

As described above, the first and second interconnects 11 and 12 of the present embodiment are formed by forming the sacrificial insulator 5 on the first interconnect layer 4, forming the second interconnect layer 6 and the organic film 9 in the sacrificial insulator 5, and etching the first interconnect layer 4 using the organic film 9 as a mask.

Therefore, the present embodiment therefore makes it possible, as similar to the first and second embodiments, to form the composite interconnects as the first and second interconnects 11 and 12, which can reduce the resistances of the first and second interconnects 11 and 12.

In addition, the present embodiment makes it possible, by etching the first interconnect layer 4 using the organic film 9 as a mask, to inhibit the etching from damaging the second interconnect layer 6.

While certain embodiments have been described, these embodiments have been presented by way of example only, and are not intended to limit the scope of the inventions.

Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a substrate;
    a first interconnect which includes a first layer provided on the substrate and formed of a first interconnect material, and a second layer provided on the first layer, formed of a second interconnect material different from the first interconnect material, and having a first lower face, and has a first width; and
    a second interconnect which includes a third layer provided on the substrate and formed of the first interconnect material, a fourth layer provided on the third layer, formed of the second interconnect material, and having a second lower face lower than the first lower face, and has a second width greater than the first width,
    wherein
    the first layer includes a first metal layer and a second metal layer provided on the first metal layer, the first metal layer being provided on a lower face of the second metal layer,
    the second layer includes a third metal layer and a fourth metal layer provided on the third metal layer, the third metal layer being provided on a lower face and a side face of the fourth metal layer,
    the third layer includes a fifth metal layer and a sixth metal layer provided on the fifth metal layer, the fifth metal layer being provided on a lower face of the sixth metal layer,
    the fourth layer includes a seventh metal layer and an eighth metal layer provided on the seventh metal layer, the seventh metal layer being provided on a lower face and a side face of the eighth metal layer.

2. The device of claim 1, wherein
    a thickness of the third layer is smaller than a thickness of the first layer, and
    a thickness of the fourth layer is larger than a thickness of the second layer.

3. The device of claim 1, wherein the first interconnect material contains tungsten, aluminum or molybdenum.

4. The device of claim 1, wherein the second interconnect material contains copper.

5. The device of claim 1, further comprising a first insulator provided on the first interconnect, wherein an air gap is provided adjacent to the first interconnect under the first insulator.

6. The device of claim 5, wherein the air gap has a lower end lower than a lower face of the first layer.

7. The device of claim 5, wherein the air gap has an upper end higher than an upper face of the second layer.

8. The device of claim 1, further comprising a fifth layer provided on the first interconnect, formed of a second insulator, and having the first width, and a sixth layer provided on the second interconnect, formed of the second insulator, and having the second width.

9. The device of claim 1, wherein
    the first interconnect is provided in a memory cell region on the substrate, and
    the second interconnect is provided in a peripheral circuit region on the substrate.

10. The device of claim 1, wherein
    the first layer is a RIE (reactive ion etching) interconnect that configures the first interconnect,
    the second layer is a damascene interconnect that configures the first interconnect,
    the third layer is a RIE (reactive ion etching) interconnect that configures the second interconnect,
    the fourth layer is a damascene interconnect that configures the second interconnect.

* * * * *